United States Patent [19]

Colapinto

[11] Patent Number: 4,782,751
[45] Date of Patent: Nov. 8, 1988

[54] SILK-SCREEN PRINTING APPARATUS WITH OPTICAL READING DEVICE FOR REGISTRATION

[75] Inventor: Fabio Colapinto, Milan, Italy

[73] Assignee: Argon Industrie Meccaniche S.R.L., Milan, Italy

[21] Appl. No.: 39,606

[22] Filed: Apr. 16, 1987

[30] Foreign Application Priority Data

Feb. 20, 1987 [IT] Italy .................. 20889 A/87

[51] Int. Cl.⁴ .................. H04N 7/22; B41L 13/00
[52] U.S. Cl. .................. 101/126; 101/129; 101/DIG. 12; 350/618; 356/401; 358/101
[58] Field of Search .............. 101/126, DIG. 12, 114, 101/118, 129; 356/399, 400, 401; 358/101, 106, 107; 350/618

[56] References Cited

U.S. PATENT DOCUMENTS

| | | | |
|---|---|---|---|
| 3,677,146 | 7/1972 | Nielsen | 101/DIG. 12 |
| 3,986,007 | 10/1976 | Ruoff | 358/101 |
| 4,319,846 | 3/1982 | Henry | 356/401 |
| 4,492,847 | 1/1985 | Masaki | 358/101 |
| 4,516,495 | 5/1985 | Ericsson | 101/129 |
| 4,580,886 | 4/1986 | Hajnal | 358/225 |
| 4,636,080 | 1/1987 | Feldman | 356/401 |

FOREIGN PATENT DOCUMENTS

| | | | |
|---|---|---|---|
| 0126723 | 11/1984 | European Pat. Off. | |
| 159401 | 12/1980 | Japan | 350/618 |
| 135808 | 7/1985 | Japan | 358/101 |

OTHER PUBLICATIONS

Charschan; Western Electric, Tech. Digest No. 20; 10/70; pp. 19 and 20; Laser Scribing Apparatus.
Hanson; Western Electric, Tech. Digest No. 26; 4/72; pp. 35 and 36; Picturephone Target Array.
H. Bloem; IBM Tech. Disc. Bul., vol. 21, No. 9, 2/79; pp. 3599 and 3600; Master Artwork Generator.
IBM Tech. Disc. Bul., vol. 28, No. 2; 7/85; pp. 619 and 620; TV Camera Periscope.

Primary Examiner—Clyde I. Coughenour
Attorney, Agent, or Firm—Herbert Dubno

[57] ABSTRACT

The silk-screen printing apparatus with optical reading device for detecting the registration marks of a printing support on a printing plane comprises a feeder element for the printing support which feeds the printing plane supported by a framework and elements for detecting the position of the printing support in the printing plane. The framework supports TV cameras. The device is equipped for the orientation of a printing frame driven by the TV cameras and surfaces for the reflection of the image of the registration marks of the printing support towards the TV cameras.

19 Claims, 4 Drawing Sheets

SILK-SCREEN PRINTING APPARATUS WITH OPTICAL READING DEVICE FOR REGISTRATION

FIELD OF THE INVENTION

The present invention relates to a silk-screen printing apparatus with on optical reading device for detecting registration marks of a printing support on a printing plane.

BACKGROUND OF THE INVENTION

Devices and methods for detecting the position of a sheet or of any printing support on a printing plane in a silk-screen printing apparatus have been known for some time.

In particular, European patent application No. 0126723 describes an optical device for detecting the position of the registration marks of a sheet or another printing support which comprises two TV cameras, each supported at the end of extendable elements, such as pneumatic pistons, which move them from a region outside the printing plane above the latter and then to the printing support. By means of the two TV cameras, the position of the registration marks, provided on the printing support, is detected, and according to their displacement relatively to the exact position which they should assume if the printing support were positioned correctly on the printing plane, a printing frame is orientated so as to eliminate any error of position of the printing support on the printing plane.

The device of this European application significantly improves the precision with which the offset between the real position and the theoretical position of the printing support on the printing plane is eliminated, is characterized by the fact that the weight of the TV cameras causes a rapid wear of the extendable elements so that they increasingly tend to no longer move the respective TV cameras to the same reading point, especially after a number of operating cycles.

This imprecision in the positioning of the TV camera is also due to the inertia generated by the mass of the TV camera during its motion.

Moreover, in order to contain maximally the disadvantages described above, the supporting elements of the TV cameras must be provided with high precision mechanics, which entails an increase in the costs of manufacture of the optical reading device, and the TV cameras are provided with sophisticated electronics and are produced specifically for this application.

Thus, the detection error made by the optical reading device of the European patent application is exactly equal to a displacement defined by the distance between the theoretical point at which the TV camera should stop to detect the registration marks on the printing support and the real point to which the TV camera, for the reasons described above, is actually moved by the extendable elements.

It is also known that the materials to be printed by silk-screen printing apparata are often unstable.

For these reasons, the dimensions of a product often vary after printing, aging, drying, washing, etching and stacking.

It is therefore very important to be able to perform a comparison of the work cycles subsequent to the first one, therewith or with an original model considered as a sample.

Hence it is necessary to adjust the silk-screen printing apparatus many times during the various work cycles, as well as to prepare and adjust the same at the beginning of the first work cycle, with a significant waste of time with disadvantageous management cost and idle times.

By means of the prior-art optical reading devices for detecting registration marks, only the registration marks of the printing support on the printing plane are detected, so that a first adjustment of the printing frame, according to the displacement of its registration mark with respect to the registration marks of the printing support, is performed manually according to the experience of the operator which detects said displacement visually, by looking through, with the aim of eliminating it.

After this operation, it is necessary to have the apparatus produce a sample test print, so as to allow, as an example, a data processor to memorize the eventual displacement remaining between the registration marks of the printing support and the registration marks of the printing frame, so as to subsequently send to the stepper motors provided on the printing frame impulses suitable to position the latter so as to eliminate the existing displacement.

OBJECTS OF THE INVENTION

The object of the present invention is to eliminate the above described disadvantages by providing a silk-screen printing apparatus with an optical reading device which allows exact detection of the position of the registration marks provided on a printing support and significantly reduce the preparation and adjustment times of the silk-screen printing apparatus.

An important object of the invention is to provide an improved apparatus with an optical reading device which allows the TV cameras to be of a conventional type, so as to simplify the overall structure of the reading device.

Still another object of the invention is to provide an apparatus with an optical reading device which allows an error of detection smaller than the displacement between the theoretical point of detection of the registration marks and the real point of detection thereof.

A further object of the present invention is to provide an optical reading device which eliminates the need for at least one test print at each work cycle startup.

It is also an object of the present invention is to provide an optical reading device which allows the simple and rapid detection of the registration mark or marks provided on the printing frame without thereby needing to move the TV cameras for the detection thereof.

SUMMARY OF THE INVENTION

These objects, are achieved in a silk-screen printing apparatus with an optical reading device for detecting the registration marks of a printing support on a printing plane comprising a feeder element for the printing support which feeds a print plane supported by a framework, elements for detecting the position of the printing support on the printing plane which support TV cameras, and means for the orientation of a printing frame driven by said TV cameras. According to the invention the device comprises surfaces for the reflection of the image of the registration marks of the printing support towards the TV cameras.

BRIEF DESCRIPTION OF THE DRAWING

Further characteristics and advantages of the invention will become apparent from the description of a preferred embodiment of the apparatus with optical reading device according to the invention, with reference to the accompanying drawings, in which.

SPECIFIC DESCRIPTION

Figure 1:
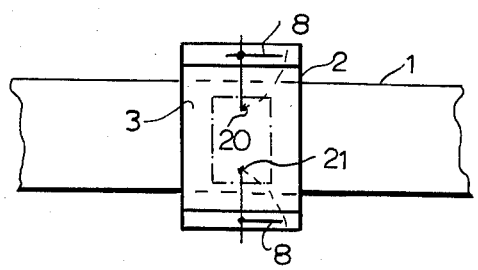
FIG. 1 is a schematic plan view of the movement performed by the plane reflecting surfaces moved above the printing support according to the invention.

With reference to the above described figures, the silk-screen printing apparatus with optical reading device according to the invention comprises a feeder element 1 which feeds a printing plane 2 supported by a framework not illustrated in the drawing.

A printing support 3, such as a plate of a printed circuit, is arranged on the printing plane and is generally provided, on opposite parts, with two reference holes or registration marks 20 and 21 according to the position of which a printing frame, also not illustrated, is oriented, so as to perform with absolute precision the required printing operation. The printing plane 2 can be considered to coincide with the paper surface of the plate 3 to be printed.

Figure 2:
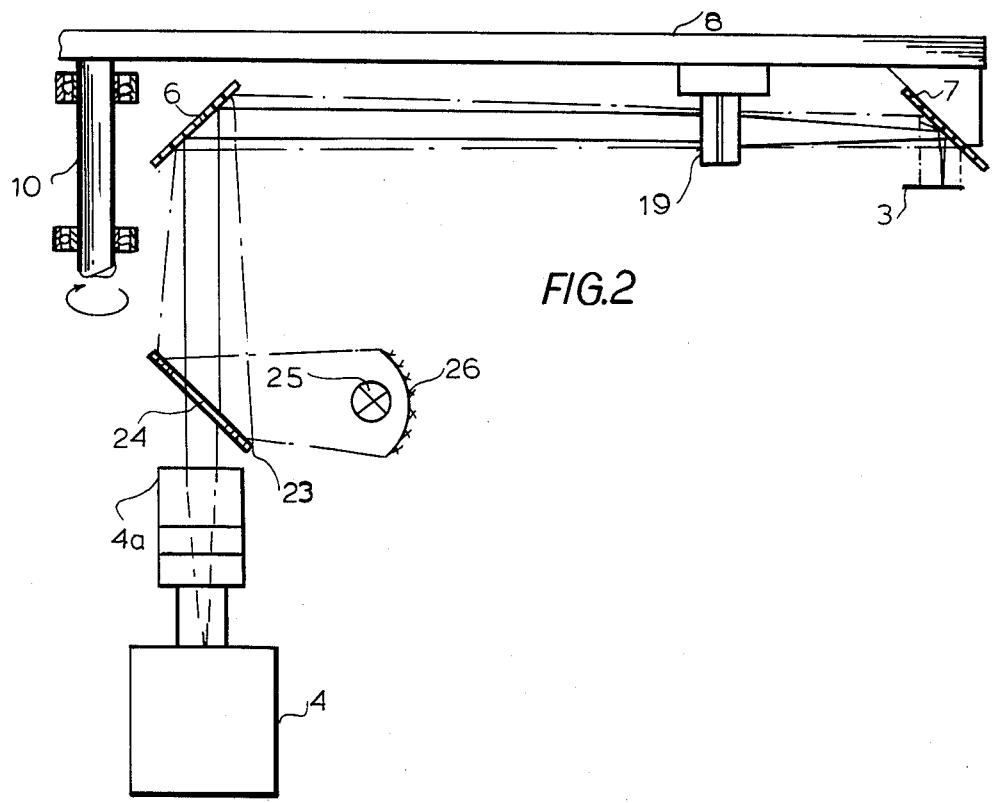
FIG. 2 is a schematic view of the operation of the optical reading device according to the invention.
Figure 3:
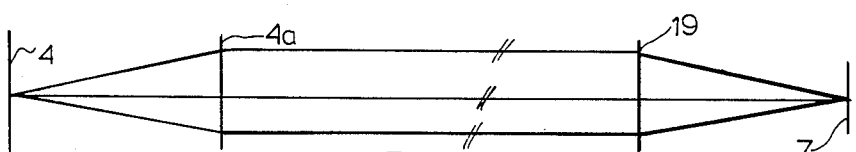
FIG. 3 is a diagram of the light pattern along the length of the supporting arm according to the invention.

In order to allow the detection, as an example, of the holes of the printed plates or to perform the comparison of registration between one print and another, as an example, two TV cameras 4 (of which only one is visible in FIG. 2) are rigidly associated with the supporting framework of the printing plane 2 or to a small arm 8, on opposite parts of this framework. The cameras 4 detect the position of the registration marks of the printing support by means of two reflecting surfaces 6 and 7 respectively associated with the frame and with the small arm 8.

For simplicity, only one of the two optical devices for reading the registration marks will be considered, it being understood that the optical device for reading the other registration mark is identical and counterposed with respect to the printing plane 2.

Figure 5:
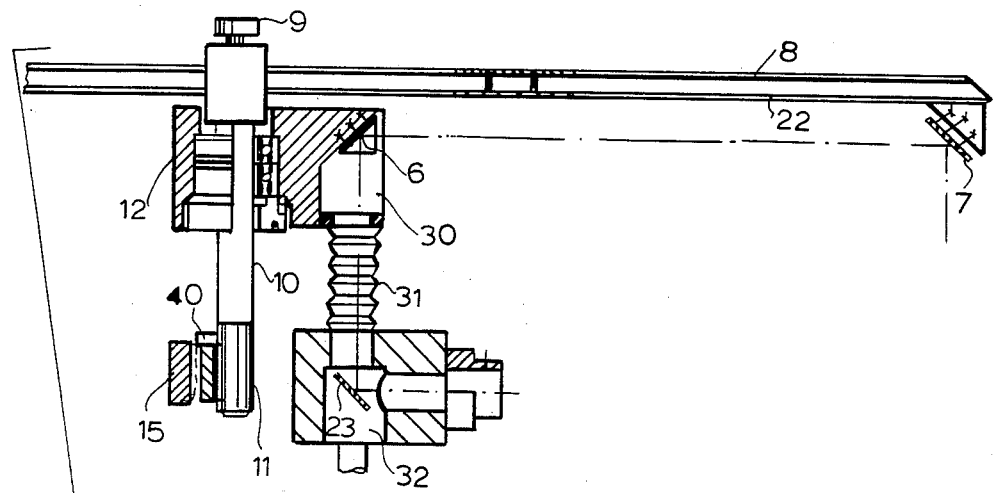
FIG. 5 is a schematic lateral elevation view of the optical reading device according to the invention.

The reflecting surface 7 is mounted on the end of the small arm 8 (FIG. 5). The arm 8 is slideable on the shaft 10, so as to vary the position of the surface 7 according to the dimensions of the printing support and is locked in position by means of a locking screw 9. The supporting shaft 10 has an axis substantially perpendicular to the axis of the small arm 8 and is provided, on an end of the shaft with a plurality of grooves 11.

Figure 4:
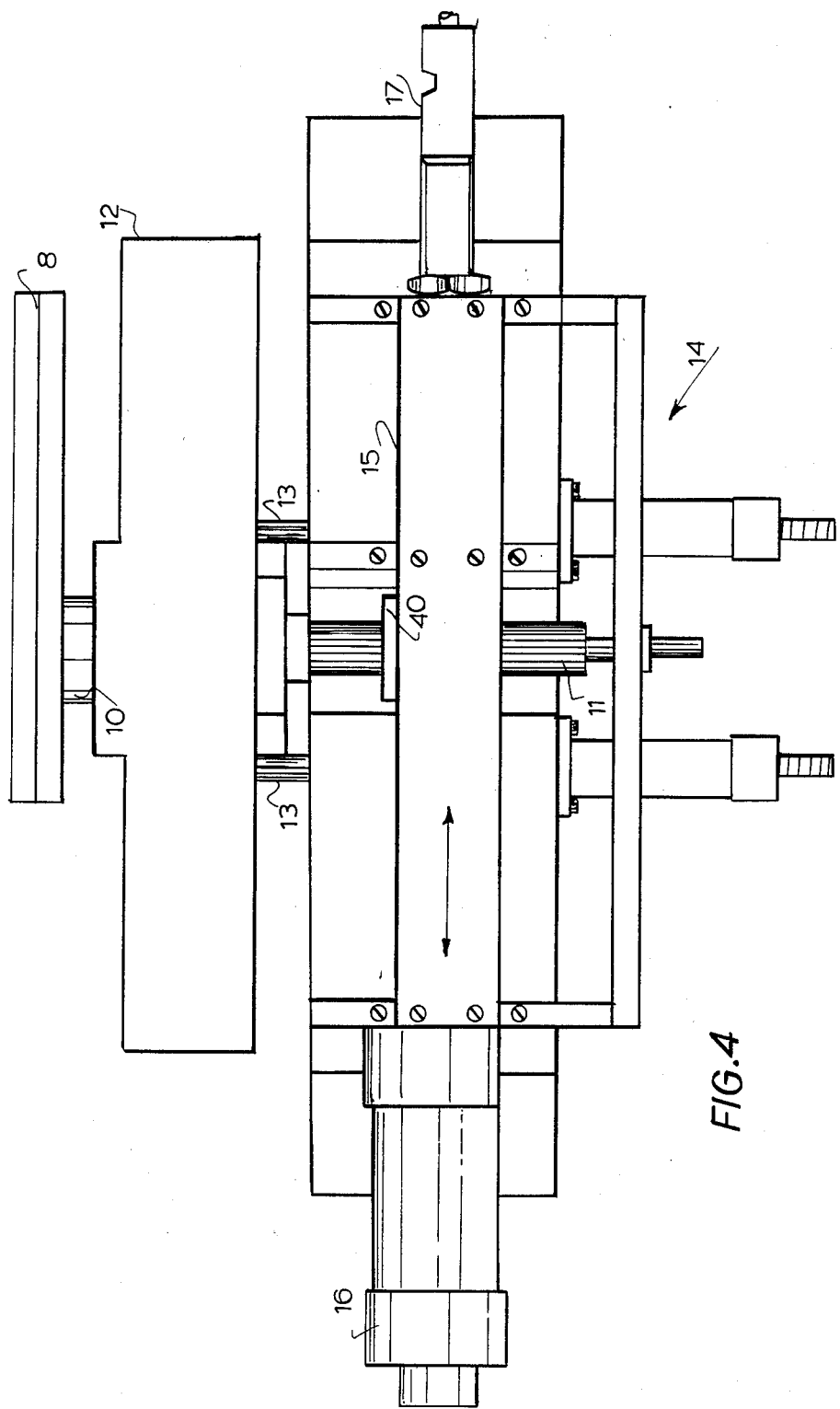
FIG. 4 is a partial lateral elevation view of the control and support elements of the arm according to the invention.

The supporting shaft 10 is rotatably associated with a supporting element 12 (FIG. 5) advantageously controlled by two pneumatic pistons 13 (FIG. 4) to move in a direction which is substantially perpendicular to the printing plane 2 (i.e. generally vertically in FIGS. 4 and 5) towards and away from a control element, generally indicated by the reference numeral 14, suitable to allow a rotation of approximately 90° of the small arm 8 as will be described hereinafter.

The control element 14 comprises a rack 15 which is movable substantially parallel to the printing plane 2, and is operated by means of a double-action piston 16 and engages in a direction which is parallel to the printing plane with a bush 40 which is slideable on the grooves 11 when the supporting element 12 moves in a direction substantially perpendicular to said printing plane.

The small arm 8 can thus be swung through 90° about the axis of shaft 10 by linear reciprocation of the rack with respect to its idle position in which it is arranged to the side and in a plane parallel to the printing plane 2 after it has been moved above by the latter after being raised by the pistons 13.

Figure 6:
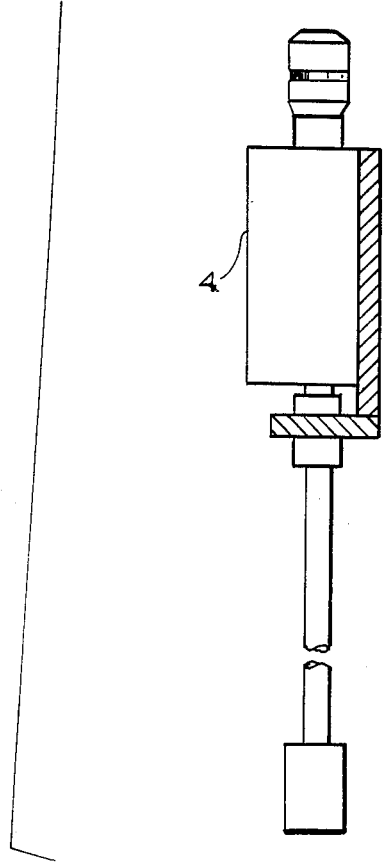
FIG. 6 is a graphic diagram, illustrating that the error of detection is always smaller than the error in position of the small arm of the printing support according to the invention.
Figure 6:
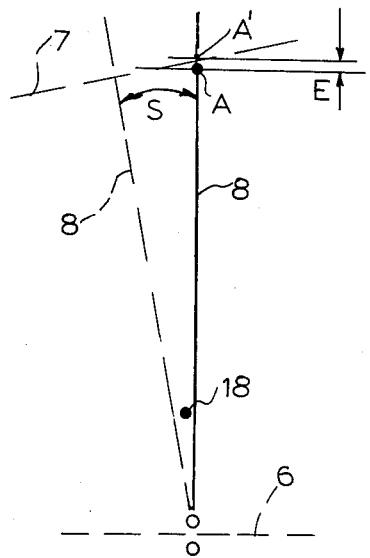
Figure 8:
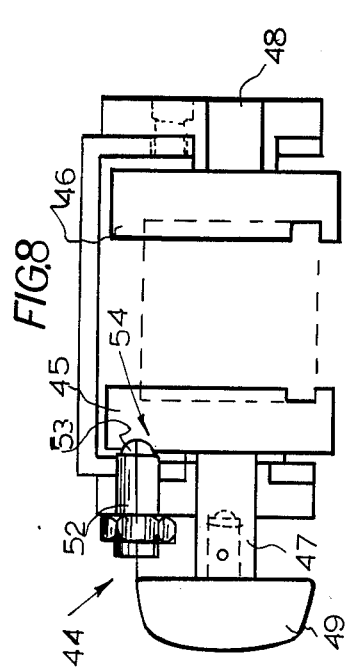
FIG. 8 is a view along the cross section line VIII—VIII of FIG. 7, illustrating the means for the actuation of the prismatic body.

At its end opposite the double-action piston 16, the rack 15 is provided with a shock absorber 17 which damp the motion of the rack before the small arm 8 reaches the end of its stroke, positioning the arm correctly on the printing plane 2 also by virtue of the presence on the frame of an arrestor pin 18 (shown only diagrammatically in FIG. 6).

The detection of, as an example, the mark 20 by the TV camera 4 is achieved by means of a system for reflecting the image of the registration marks provided by means of the reflecting surfaces 6 and 7 which are suitably inclined at 45° with respect to the plane defined printing plane 2.

Between the reflecting surfaces 6 and 7, it is possible to provide a converging lens 19 (FIG. 2) provided with a greater thickness at its center than at its edges to form a plane wave from the image of the registration marks which generate a spherical wave.

The lens 19 is supported in a longitudinal guide 22 of the small arm 8.

This embodiment allows the possibility of moving the small arm 8 and therefore the reflecting surface 7 on the supporting arm 10, according to the dimensions of the printing support provided on the printing plane and, therefore, according to the registration marks provided thereon. I can also vary the distance between the reflecting surface 6 and the lens 19, keeping unchanged the structure of the optical device by virtue of the fact that between the plane surface 6 and the lens 19, as previously mentioned, the image light wave is a planar image.

In this manner, it is possible to advantageously keep the TV cameras rigidly coupled, as an example, to the framework, totally simplifying the structure of the optical reader and at the same time achieving a perfect reading of the registration marks on printing supports of any dimension.

Between the TV camera 4 and the reflecting surface 6 a mirror 23 is interposed and advantageously provided with a central missing portion or aperture 24 thereof to allow passage of the image of the marks reflected by the surface 6. The mirror 23 is also in the path of a beam of light rays generated by a light source 25 mounted on the framework.

The light source 25 is provided with a parabolic element 26 for directing the beam of light rays with a direction substantially parallel to the printing plane 2, onto the mirror 23 suitably inclined at 45°, with respect to the printing plane 2 and having its central portion 24 arranged coaxially with respect to the TV camera 4.

Alternatively I can make use of optical fibers.

More precisely, an optical fiber is internally associated with the small arm 8, the end of said fiber directing the beam of light above the plane reflecting surface 7 and the printing support.

In this embodiment, the optical reading device is further simplified, since the concave mirror is eliminated and the problems deriving from possible interference which may occur during the reflection of the light waves are eliminated.

Again to eliminate any kind of interference in the optical reading system, the surface 6 is contained within a first chamber 30 (FIG. 5) from which a bellows 31 extends and is elastically extendable to follow the upward movements of the small arm 8.

The bellows 31 is then connected to a second chamber 32 inside which the concave mirror and the light source are accommodated, and from which a channel furthermore extends to associate with the TV camera 4 so as to avoid any outside interference between the TV camera and the second chamber 32.

Advantageously, as can be seen in FIG. 6, if the small arm 8 fails to position itself correctly at the printing plane (broken line), the displacement S defined as the distance between the theoretical position during the correct operation of the arm 8 (solid line) and the real position (broken line) thereof will give rise to a detection error "E" of the position of the registration marks which is so small as to consider "E" actually negligible in terms of the quality of the finished work. Since the conventional fixed TV camera reads by means of the surface 6, which is fixed and inclined by 45°, the direction of reading can occur only along the line OA', so that the error E generated by the displacement S can only be along the line OA'.

Figure 7:
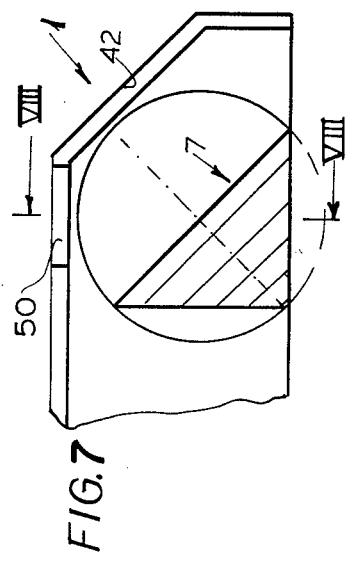
FIG. 7 is a partial lateral elevation cross section view of the end portion of the small arm with which is associated the rotatable two-position prismatic body according to the invention.

As illustrated in FIG. 7, the small arm can support at least one TV camera not illustrated in the drawing. The arm 8 has an end portion 42 provided with operating means, generally indicated at 44, which for the rotation between two positions of at least one of the reflecting surfaces and, more precisely, the reflecting surface 7. The reflecting surface 7 can then be formed by a rotatable prismatic body.

The operating means 44 comprise a first and a second element for supporting said prismatic body, indicated respectively by 45 and 46, and at least one knob connected to said first supporting element 45 provided with a pivot 47 for rotation, provided with its axis coincident with the axis of a second rotation pivot 48 rigidly coupled to said second supporting element 46.

In this manner, the prismatic body, by means of the manual operation of the knob 49, can be made to rotate substantially through 90° so as to be able to transmit to the TV camera, by virtue of the presence, on the side facing towards said printing frame, of a hole 50, the image of the registration mark provided on the printing frame.

Figure 10:
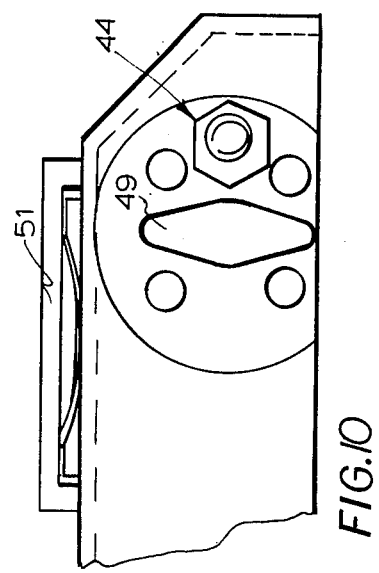
FIG. 10 is a lateral elevation view of the end portion of the small arm according to the invention.
Figure 9:
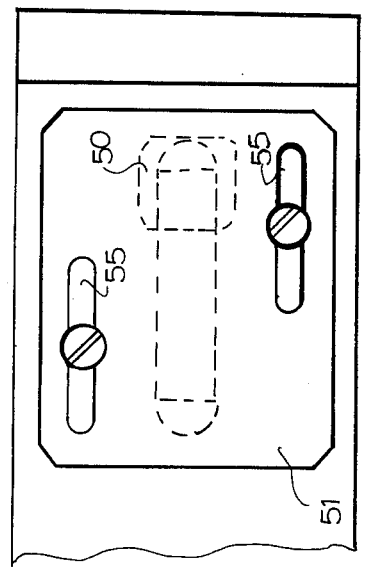
FIG. 9 is a partial plan view of the end portion of the small arm on which it is possible to see the small plate for the opening and the closure of the hole according to the invention.

In order to ensure that, after the detection of the registration mark of the printing frame, and therefore after the subsequent positioning of the prismatic body so as to detect the registration marks of the printing support, the prismatic body is not affected by light beams passing through the hole 50, the latter is closed by means of a small plate 51 slideable on the small arm (FIGS. 9 and 10).

For the sake of greater clarity, it should be furthermore noted that the operating means comprise a positioning element 52 provided with at least one small elastically resilient pin 53 which engages with an abutment seat 54 accommodated in said first supporting element 45 so as to relocate exactly the prismatic body after detecting the registration mark provided on the printing frame.

Advantageously, the simple prism can be replaced by a double one, so as to allow the direct detection both of the registration mark of the latter and the registration marks of the printing support without thereby having to rotate the prismatic body.

The operation of the optical reading device according to the invention is evident from what has been described and illustrated, and in particular with reference to the figures, it can be observed that to perform the preparation and the adjustment of the device before each work cycle it is sufficient to merely slide the small plate 51 by virtue of the presence thereon of two slots 55, so as to open the hole 50 and then, by acting on the knob 49, to rotate through 90° the prismatic body so that the latter transmits to the TV camera the exact position of the registration mark of the printing frame. The hole 50 is subsequently closed by means of the plate 51, and the prismatic body is returned to the initial position, so that the latter detects the registration marks provided on the printing support so that a data processor, by measuring the displacement between the registration marks of the printing support and the registration marks of the printing frame, sends impulses to the stepper motors for the correct positioning of the printing frame and the elimination of said displacement. In practice, it has been observed that the optical reading device according to the invention is particularly advantageous for the total elimination of the error of detection of the registration marks on a printing support with respect to prior art apparatus, to significantly reduce the preparation times of the silk-screen apparatus in order to avoid the need for at least one test print required to allow the data processor to provide the exact positioning of the printing frame with respect to the registration marks of the printing support.

The device of the invention is furthermore provided with an extremely simple structure which does not entail the construction of complicated kinematic structures and which is suitable for application to any already existing silk-screen printing apparatus.

What is claimed is:

1. A registration-mark detector for a silk-screen printing apparatus having a printing plane in which an object to be printed, having at least one registration mark, can be positioned, said detector comprising:
    means defining a path for said object to permit said object to be positioned in said printing plane;
    a framework disposed along said path;

a video camera substantially stationarily fixed to said framework;

an arm mounted on said framework for swinging movement between a position in which said arm lies alongside said object and a position in which said arm overhangs said object; and optical means including a plurality of reflective surfaces including at least one reflective surface on said arm for deriving an optical image of the registration mark of said object and transmitting said optical image to said camera when said arm is positioned over said object.

2. The registration-mark detector defined in claim 1 wherein said arm is mounted on a shaft having a grooved end and pivotable in a support on said framework and axially shiftable therein in a direction perpendicular to said plane, said arm being parallel to said plane and perpendicular to said shaft, said shaft being operatively connected to an operator having means for axially displacing said shaft and thereby displacing said arm from an idle position wherein said arm lies substantially in said plane into an operative position wherein said arm overlies said plane.

3. The registration-mark detector defined in claim 2 wherein another of said reflective surfaces is provided on said support.

4. The registration-mark detector defined in claim 3, further comprising a converging lens mounted on said arm between said reflective surfaces, said converging lens being thicker at its center than at its edges.

5. The registration-mark detector defined in claim 3 wherein said optical means includes a further reflective surface on said support between said other reflective surface and said camera and having a nonreflective central portion traversed by a light ray passing from said other reflective surface to said camera, a light source mounted on said support, and a concave mirror on said support for reflecting light from said source onto said further reflective surface whereby said further reflective surface reflects the light from said source onto said other reflective surface, said one reflective surface and said object.

6. The registration-mark detector defined in claim 5 wherein said nonreflective central portion is axially aligned with a lens of said camera.

7. The registration-mark detector defined in claim 3 wherein all of said reflective surfaces are oriented at angles of 45° with said plane.

8. The registration-mark detector defined in claim 5 wherein both of said reflective surfaces are oriented at angles of 45° with said plane.

9. The registration-mark detector defined in claim 5 wherein said other reflective surface is disposed in a first chamber formed in said support; said further reflective surface, said light source and said mirror lying in a second chamber of said support connected with said first chamber by a bellows; said camera being connected to said second chamber.

10. The registration-mark detector defined in claim 3 wherein said operator includes a rack movable parallel to said plane and meshing with teeth on a bush axially slidable on but angularly coupled with said grooved end of said shaft, and a double-action fluid-operated piston unit connected to said rock for displacing same to rotate said shaft and swing said arm.

11. The registration-mark detector defined in claim 10 wherein said operator includes a shock absorber connected to an end of said rack opposite an end thereof connected to said unit.

12. The registration-mark detector defined in claim 10, further comprising an arrestor pin engageable with said arm for limiting the swing thereof.

13. The registration-mark detector defined in claim 3, further comprising means for rotating at least one of said reflective surfaces between a first alternative position in which an image of said registration mark is delivered to said camera and a second alternative position in which an image of a reference mark on said framework is delivered to said camera.

14. The registration-mark detector defined in claim 13 wherein said means for rotating is located at a free end of said arm and rotates said one of said reflective surfaces at said free end.

15. The registration-mark detector defined in claim 14 wherein said one of said reflective surfaces is formed on a prismatic body.

16. The registration-mark detector defined in claim 14 wherein said means for rotating includes a pair of members engaging said prismatic body at opposite sides thereof, means for rotatably mounting said members in said arm at said free end thereof, and a manipulating knob located externally of said arm and coupled to said members.

17. The registration-mark detector defined in claim 16, further comprising a resiliently biased pin engageable with one of said members for indexing said prismatic body selectively in each of the alternative positions thereof.

18. The registration-mark detector defined in claim 16, further comprising a hole formed in said arm and positioned to permit an image of said reference mark to be picked up by said prismatic body.

19. The registration-mark detector defined in claim 18, further comprising a cover slidable on said arm for selectively blocking and unblocking said hole.

* * * * *